(12) United States Patent
Yang et al.

(10) Patent No.: US 6,518,134 B2
(45) Date of Patent: Feb. 11, 2003

(54) METHOD FOR FABRICATING A SEMICONDUCTOR DEVICE WITH AN AIR TUNNEL FORMED IN THE LOWER PART OF A TRANSISTOR CHANNEL

(75) Inventors: Kuk-Seung Yang, Ichon (KR); Hee-Yong Yun, Ichon (KR)

(73) Assignee: Hynix Semiconductor Inc., Ichon (KR)

( * ) Notice: Subject to any disclaimer, the term of this patent is extended or adjusted under 35 U.S.C. 154(b) by 0 days.

(21) Appl. No.: 10/024,286

(22) Filed: Dec. 21, 2001

(65) Prior Publication Data

US 2002/0081793 A1 Jun. 27, 2002

(30) Foreign Application Priority Data

Dec. 26, 2000 (KR) ........................................ 2000-81746

(51) Int. Cl.[7] ............................................. H01L 21/336
(52) U.S. Cl. ...................... 438/301; 438/305; 438/478; 438/488
(58) Field of Search ................................ 438/300, 301, 438/303, 305, 306, 478, 488, 494, 933

(56) References Cited

U.S. PATENT DOCUMENTS 5,531,121 A * 7/1996 Sparks et al. ................. 73/716
5,990,532 A * 11/1999 Gardner ....................... 257/410

FOREIGN PATENT DOCUMENTS

JP        2-187038 A  *  7/1990  ......... H01L/21/338

* cited by examiner

*Primary Examiner*—Olik Chaudhuri
*Assistant Examiner*—Stephen W. Smoot
(74) *Attorney, Agent, or Firm*—Jacobson Holman PLLC

(57) ABSTRACT

A method for fabricating a semiconductor device, which improves the threshold voltage by forming an air tunnel in the lower part of the transistor channel of a semiconductor device, and also improves the short channel effect by making better the sub-threshold voltage properties and increasing the internal pressure between the drain and the source, as well as improving the ESD (electrostatic discharge) property.

18 Claims, 6 Drawing Sheets

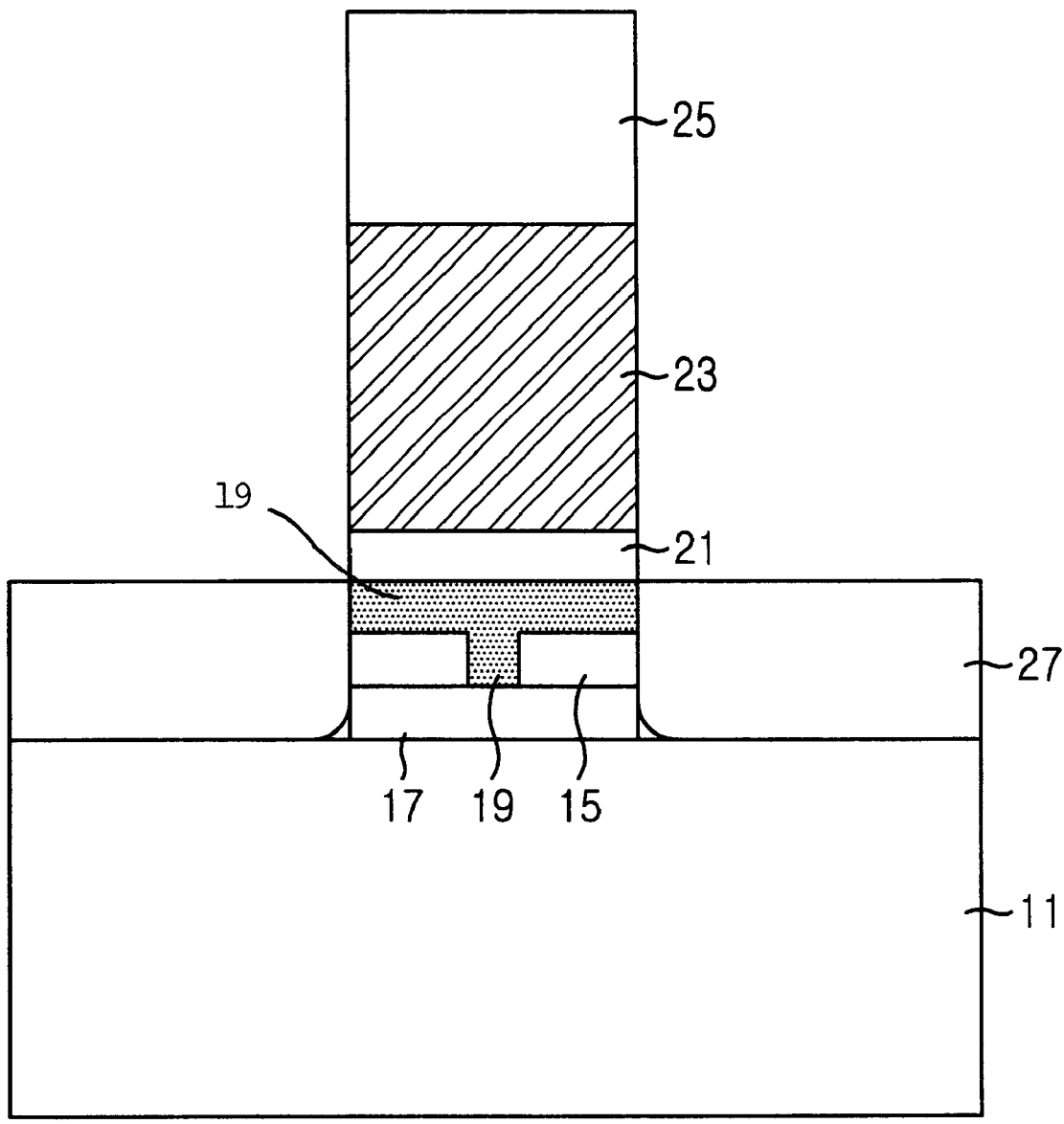

METHOD FOR FABRICATING A SEMICONDUCTOR DEVICE WITH AN AIR TUNNEL FORMED IN THE LOWER PART OF A TRANSISTOR CHANNEL

FIELD OF THE INVENTION

The present invention relates to a method for fabricating a semiconductor device; and, more particularly, to a method for fabricating a highly integrated semiconductor device with improved operation and reliability by forming an air tunnel in the lower part of the transistor channel.

DESCRIPTION OF RELATED ART

Generally, to form a PN junction, n-type or p-type impurities are injected in a p-type or n-type diffusion region of a semiconductor substrate, and the impurities are activated by a thermal treatment.

Accordingly, in a semiconductor device with a reduced channel width, the junction should be formed with a shallow depth to prevent a short channel effect resulting from side-diffusion from the diffusion region.

A conventional method for fabricating a MOS field effect transistor is as follows.

First of all, a device isolation layer is formed on a semiconductor substrate, and a gate insulation layer and a polysilicon layer are formed on the semiconductor substrate.

Then, a gate electrode is formed by etching the polysilicon layer and the gate insulation layer with a gate electrode mask, which is used as an etching mask.

Subsequently, a lightly doped drain (LDD) region is formed by ion-injecting low-concentration impurities in the semiconductor substrate at both sides of the gate electrode.

Thereafter, an insulation layer is formed on the semiconductor substrate, and spacers are formed on sides of the gate electrode by etching the isolation layer.

A MOS field effect transistor is formed by forming a source/drain region after highly concentrated impurities are ion-injected into the semiconductor substrate at both sides of the insulation layer spacer.

In the conventional method for fabricating a semiconductor device, the more integrated the device becomes, the shorter the channel grows. Punch-through occurs as the result of a drop of internal pressure between the sources and the drains. As a result, the drain current is not saturated even in the saturation region and increases along with an increase of the drain voltage. In addition, there is a problem that it is difficult to expect the device to work properly and serve the role of a control device, because the sub-threshold voltage decreases and thus electric current increases in the non-operation region.

SUMMARY OF THE INVENTION

It is, therefore, an object of the present invention to provide a method for fabricating a semiconductor device, which improves the operation properties and reliability by forming an air tunnel in the lower part of the transistor channel and improving the short channel effect and the ESD (electrostatic discharge) effect.

In accordance with an embodiment of the present invention, there is provided a method for fabricating a semiconductor device, comprising the steps of: forming a first semiconductor layer and a second semiconductor layer in order on a semiconductor substrate, wherein the first and the second semiconductor have different etch rates; forming a contact hole by selectively etching the second semiconductor layer, wherein a portion of the first semiconductor layer is exposed; forming an air tunnel by wet-etching the first semiconductor layer exposed through the contact hole; forming a third semiconductor layer on the second semiconductor layer and in the contact hole, wherein a channel region consisting of the second and the third semiconductor layers overlapped with the air tunnel is formed; forming a gate insulation layer and a gate electrode on the third semiconductor layer; and forming a source/drain region in the first to third semiconductor layers.

In accordance with another embodiment of the present invention, there is provided a method for fabricating a semiconductor device, comprising the steps of: forming a first semiconductor layer and a second semiconductor layer in order on a semiconductor substrate, wherein the first and the second semiconductor have different etch rates; forming a contact hole by selectively etching the second semiconductor layer, wherein a portion of the first semiconductor layer is exposed; forming an air tunnel by wet-etching the first semiconductor layer exposed through the contact hole; forming a third semiconductor layer on the second semiconductor layer and in the contact hole, wherein a channel region consisting of the second and the third semiconductor layers overlapped with the air tunnel is formed; forming a gate insulation layer and a gate electrode on the third semiconductor layer; forming a lightly doped drain region in the first to the third semiconductor layers at both sides of the gate insulation layer; forming spacers at sides of the gate electrode and the gate insulation layer; and forming a source/drain region in the first to the third semiconductor layers and in the semiconductor substrate at both sides of the spacers.

BRIEF DESCRIPTION OF THE DRAWINGS

The above and other objects and features of the present invention will become apparent from the following description of the preferred embodiments given in conjunction with the accompanying drawings, in which:

FIGS. 1A to 1E are cross-sectional views illustrating a method for fabricating a semiconductor device in accordance with the present invention;

DETAILED DESCRIPTION OF THE INVENTION

Other objects and aspects of the invention will become apparent from the following description of the embodiments with reference to the accompanying drawings, which is set forth hereinafter.

FIGS. 1A to 1E are cross-sectional views illustrating a method for fabricating a semiconductor device in accordance with the present invention.

Figure 1A:
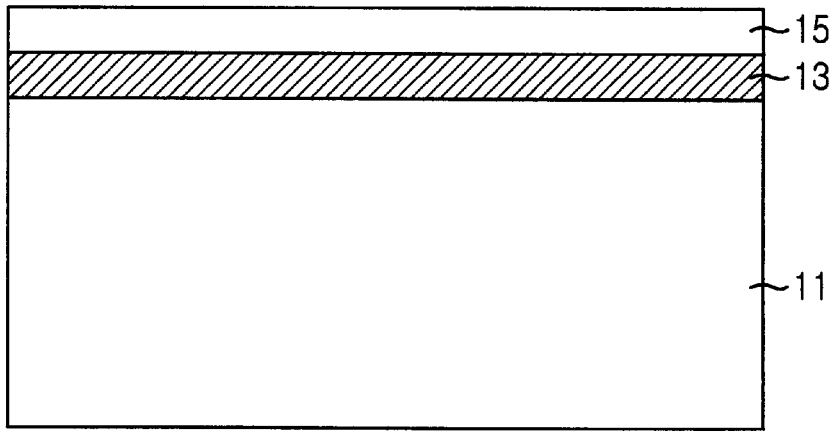

Referring to FIG. 1A, an SiGe layer 13 and a first polysilicon layer 15 are formed in order on a semiconductor substrate 11. The first polysilicon layer 15 is a doped or an undoped polysilicon layer. At this time, the SiGe layer 13 is grown by an expitaxial growth method, and the first polysilicon layer 15 is also formed by the epitaxial growth method or by a deposition method, each layer being formed in a thickness ranging from 50 Å to 500 Å. The SiGe layer 13 can be replaced with various semiconductor layers of which the etch rates are different from the polysilicon layer.

Figure 1B:
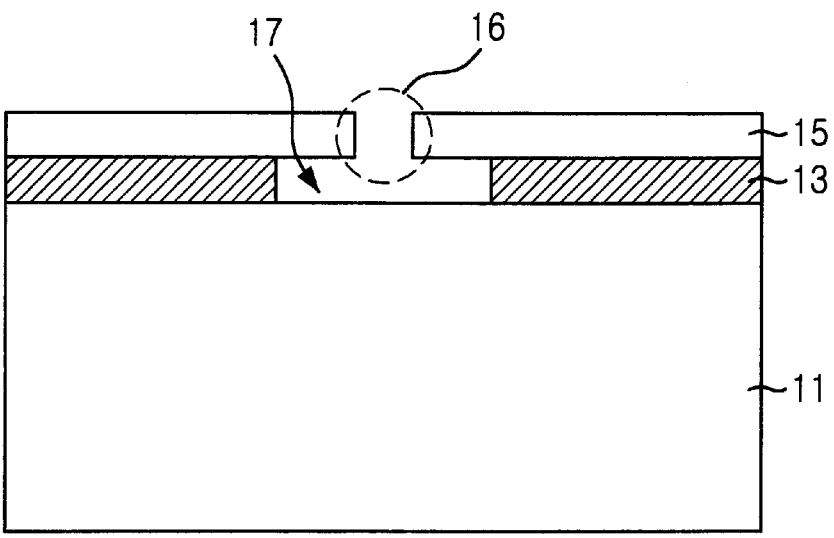

Referring to FIG. 1B, a contact hole 16 is formed by etching the first polysilicon layer 15 with a contact mask (not shown), which is used as an etch mask for exposing part of a region reserved for a gate electrode.

Subsequently, the SiGe layer 13 exposed through the contact hole 16 is wet etched to form an air tunnel 17. The width of the air tunnel 17 is somewhat wider than that of a gate electrode to be formed in the subsequent procedures.

Figure 1C:
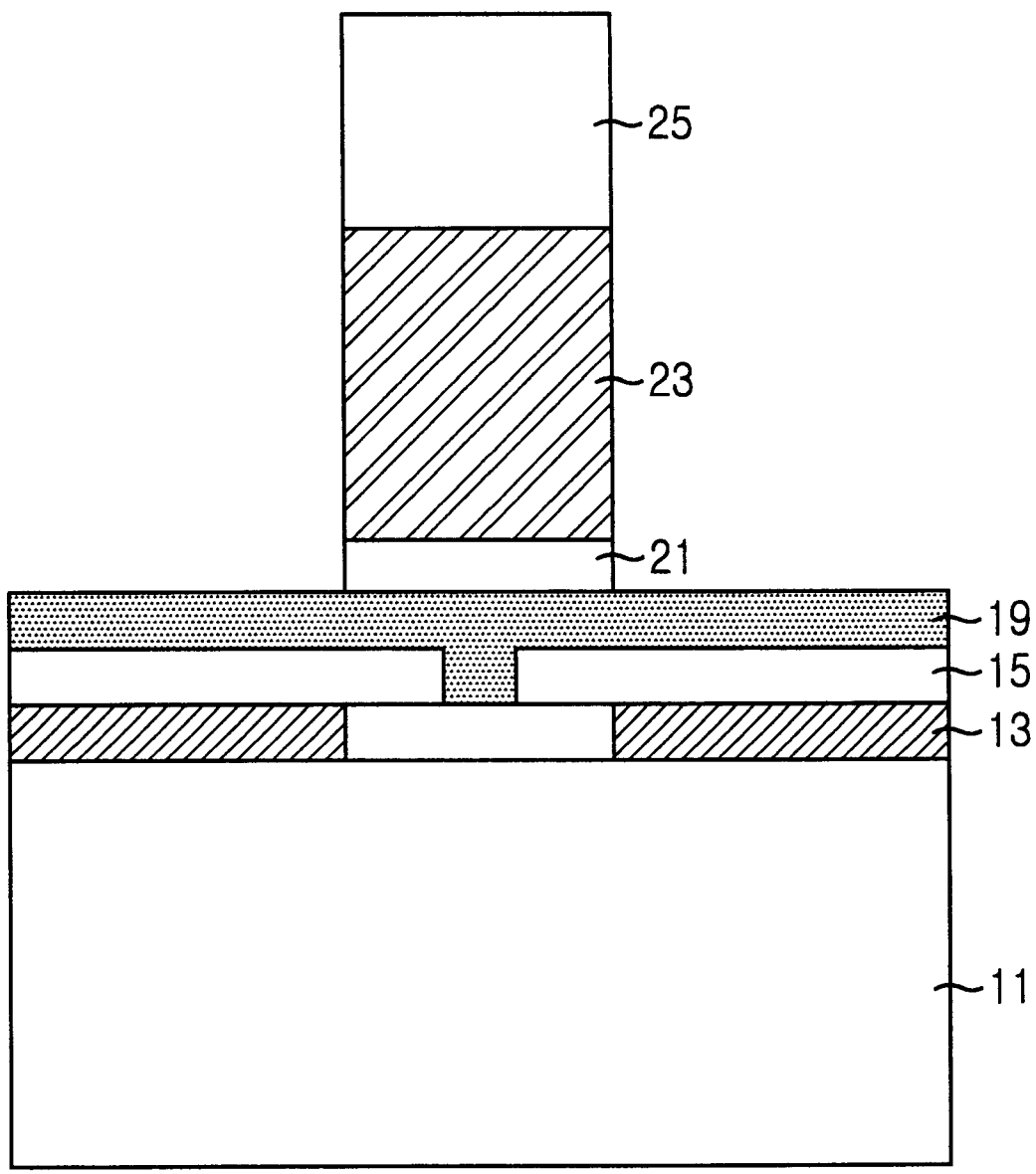

Referring to FIG. 1C, a second polysilicon layer 19 is formed on the first polysilicon layer 15, and at this time the contact hole 16 on the air tunnel 17 is filled with the second polysilicon layer 19. The first polysilicon layer 15 and the second silicon layer 19 overlapped with the air tunnel 17 form the channel region of the transistor.

Next, a gate insulation layer, a conductor layer for a gate electrode and a mask insulation layer are formed on the entire surface of the substrate.

Subsequently, a stacked structure pattern comprising a gate insulation layer pattern 21, a gate electrode 23 and a mask insulation layer pattern 25 is formed by etching the mask insulation layer, the conductor layer and the gate insulation layer, with a gate electrode mask defining the pattern of the gate electrode 23.

Referring to FIG. 1D, a lightly doped drain (LDD) region 27 is formed by implanting low-concentrated impurities into the second polysilicon layer 19, the first polysilicon layer 15 and the SiGe layer 13 at both sides of the stacked structure pattern.

Figure 1E:
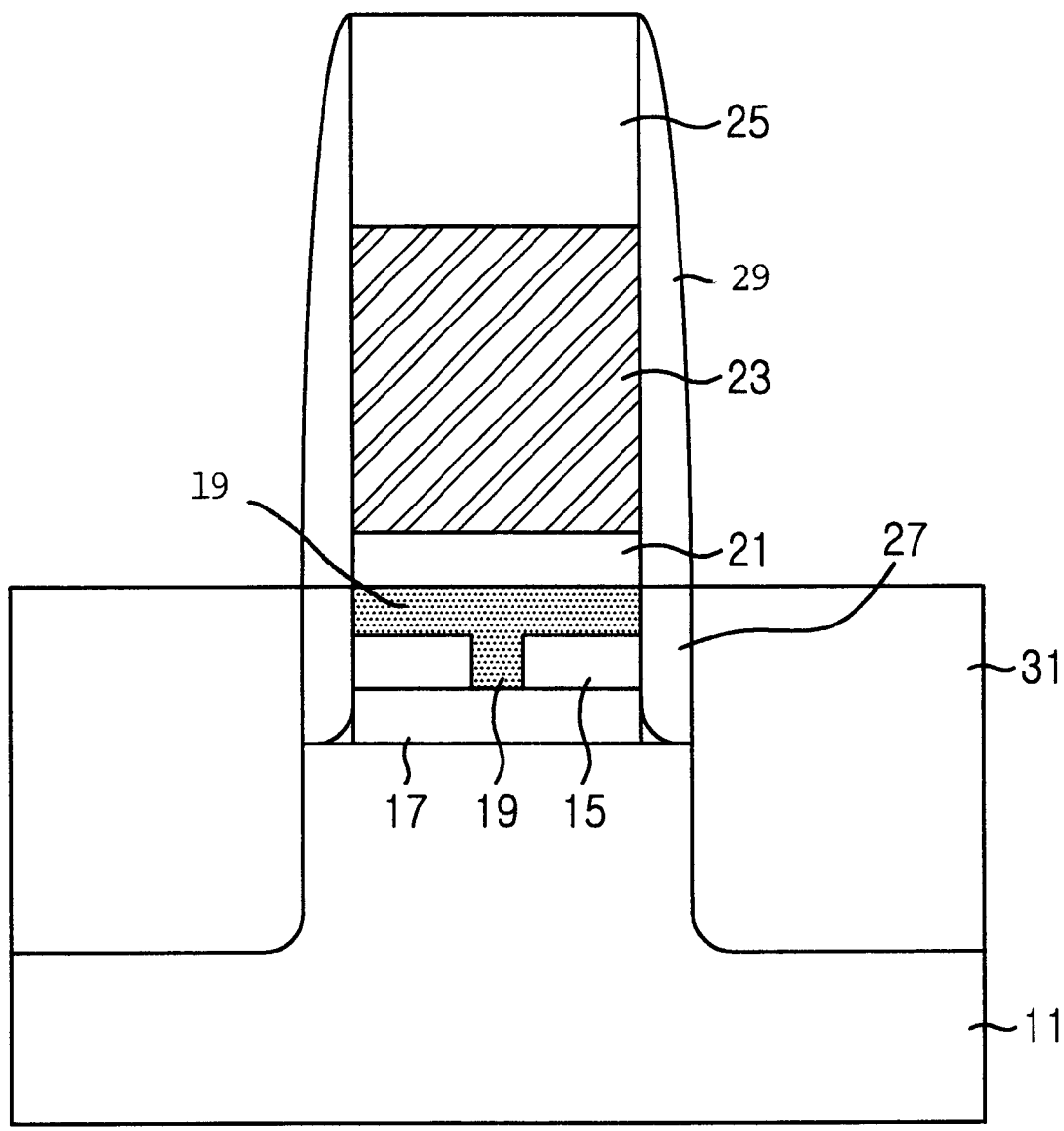

Referring to FIG. 1E, insulation layer spacers 29 are formed on the sides of the stacked structure pattern.

Next, a source/drain region 31 is formed by implanting high-concentrated impurities into the second polysilicon layer 19, the first polysilicon layer 15, the SiGe layer 13 and the semiconductor substrate 11 at both sides of the insulation layer spacer 29.

Figure 2:
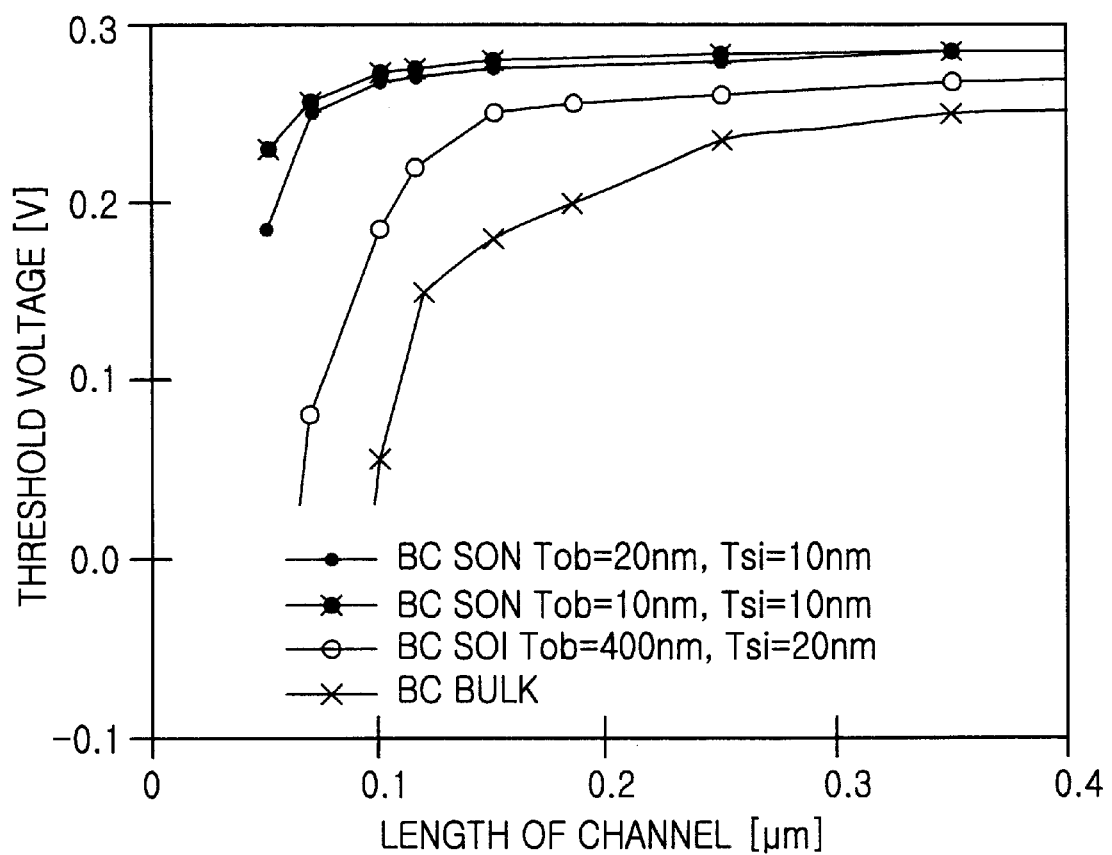
FIG. 2 is a graph showing the property of threshold voltage plotted against the channel length of a semiconductor device fabricated in accordance with the present invention.

FIG. 2 is a graph plotting the characteristic of a threshold voltage in relation to the channel length of a semiconductor device fabricated in accordance with the present invention. FIG. 2 shows that the threshold voltage characteristic of the device formed on the substrate, denoted as SON in FIG. 2, having the air tunnel in accordance with the present invention, is improved in comparison with devices formed on a bulk substrate or silicon-on-insulator(SOI) substrate.

Figure 3:
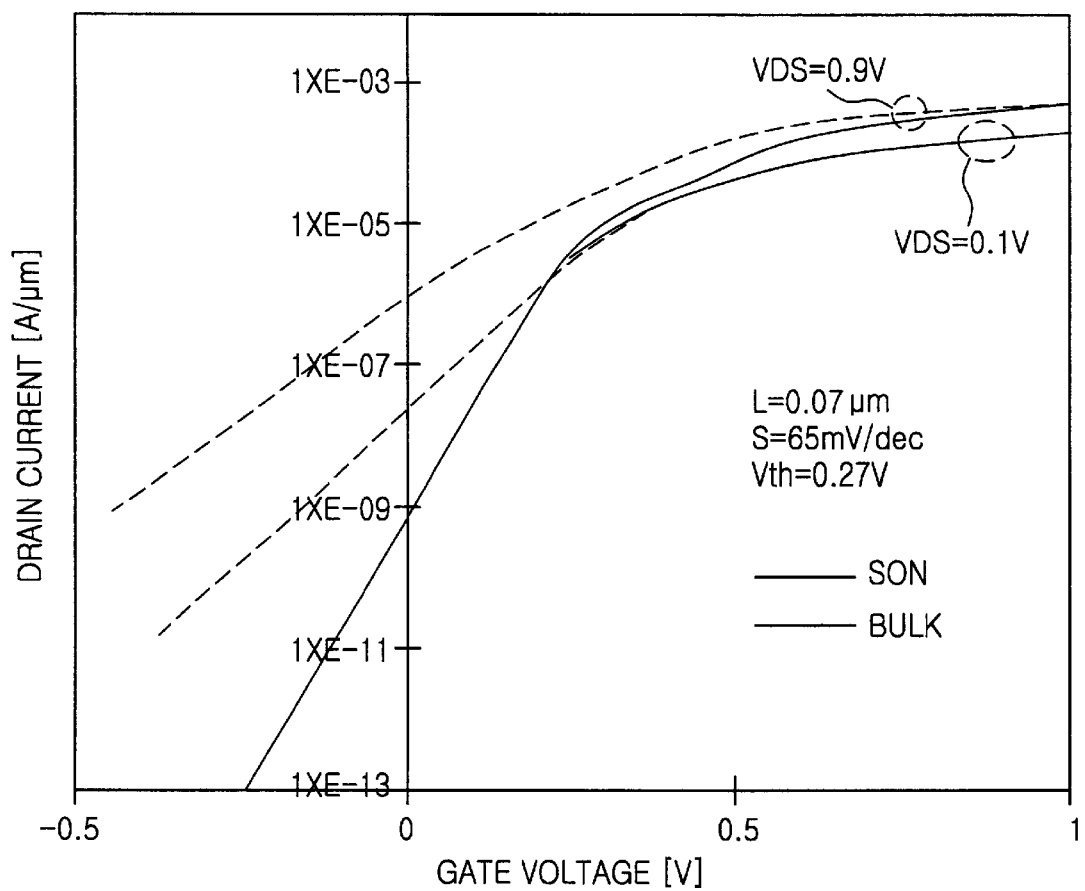
FIG. 3 is a graph showing the property of gate voltage plotted against drain current of a semiconductor device fabricated in accordance with the present invention.

FIG. 3 is a graph plotting the property of gate voltage in relation to drain current of a semiconductor device formed in accordance with the present invention. The graph shows an improvement in the drain current properties, when a bulk substrate and a substrate using an air tunnel are used (See FIG. 3).

As described above, the method for fabricating a semiconductor device in accordance with the present invention, improves the threshold voltage characteristic by forming an air tunnel in the lower part of the transistor channel of a semiconductor device, and also solves the problem of the short channel effect by improving the sub-threshold voltage properties and increasing the internal pressure between the drain and the source, as well as improving the electrostatic discharge (ESD) property.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a first semiconductor layer and a second semiconductor layer in order on a semiconductor substrate, wherein the first and the second semiconductor have different etch rates;

forming a contact hole by selectively etching the second semiconductor layer, wherein a portion of the first semiconductor layer is exposed;

forming an air tunnel by wet-etching the first semiconductor layer exposed through the contact hole;

forming a third semiconductor layer on the second semiconductor layer and in the contact hole, wherein a channel region consisting of the second and the third semiconductor layers overlapping with the air tunnel is formed;

forming a gate insulation layer and a gate electrode on the third semiconductor layer; and forming a source/drain region in the first to third semiconductor layers.

2. The method as recited in claim 1, wherein the first semiconductor layer is formed as a SiGe layer.

3. The method as recited in claim 2, wherein the SiGe layer is formed by an epitaxial growth method.

4. The method as recited in claim 3, wherein the SiGe layer is formed in a thickness ranging from 50 Å to 500 Å.

5. The method as recited in claim 2, wherein the second semiconductor layer is formed as a polysilicon layer.

6. The method as recited in claim 5, wherein the polysilicon layer is formed by an epitaxial growth method.

7. The method as recited in claim 5, wherein the polysilicon layer is a layer chosen from the group consisting of a doped polysilicon layer and an undoped polysilicon layer.

8. The method as recited in claim 5, wherein the polysilicon layer is formed in a thickness ranging from 50 Å to 500 Å.

9. The method as recited in claim 2, wherein the third semiconductor layer is formed as a polysilicon layer.

10. A method for fabricating a semiconductor device, comprising the steps of:

forming a first semiconductor layer and a second semiconductor layer in order on a semiconductor substrate, wherein the first and the second semiconductor have different etch rates;

forming a contact hole by selectively etching the second semiconductor layer, wherein a portion of the first semiconductor layer is exposed;

forming an air tunnel by wet-etching the first semiconductor layer exposed through the contact hole;

forming a third semiconductor layer on the second semiconductor layer and in the contact hole, wherein a channel region consisting of the second and the third semiconductor layers overlapping with the air tunnel is formed;

forming a gate insulation layer and a gate electrode on the third semiconductor layer;

forming a lightly doped drain region at both sides of the first to third semiconductor layers;

forming spacers at both sides of the gate electrode and the gate insulation layer; and forming a source/drain region in the first to the third semiconductor layers and in the semiconductor substrate at both sides of the spacers.

11. The method as recited in claim 10, wherein the first semiconductor layer is formed as a SiGe layer.

12. The method as recited in claim 11, wherein the SiGe layer is formed by an epitaxial growth method.

13. The method as recited in claim 12, wherein the SiGe layer is formed in a thickness ranging from 50 Å to 500 Å.

14. The method as recited in claim 11, wherein the second semiconductor layer is formed as a polysilicon layer.

15. The method as recited in claim 14, wherein the polysilicon layer is formed by an epitaxial growth method.

16. The method as recited in claim 14, wherein the polysilicon layer is a layer chosen from the group consisting of a doped polysilicon layer and an undoped polysilicon layer.

17. The method as recited in claim 14, wherein the polysilicon layer is formed in a thickness ranging from 50 Å to 500 Å.

18. The method as recited in claim 11, wherein the third semiconductor layer is formed as a polysilicon layer.

* * * * *